(12) United States Patent
Tucker

(10) Patent No.: US 7,170,338 B1
(45) Date of Patent: Jan. 30, 2007

(54) CHOPPER STABILIZATION CIRCUITS AND METHODS

(75) Inventor: John Christopher Tucker, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 134 days.

(21) Appl. No.: 11/088,654

(22) Filed: Mar. 24, 2005

(51) Int. Cl.
*H03F 1/02* (2006.01)

(52) U.S. Cl. ............... 330/9; 330/253; 330/69
(58) Field of Classification Search ............ 330/9, 330/253, 69
See application file for complete search history.

(56) References Cited

U.S. PATENT DOCUMENTS

| | | |
|---|---|---|
| 4,939,516 A | 7/1990 | Early |
| 5,039,989 A | 8/1991 | Welland |
| 5,079,550 A | 1/1992 | Seech |
| 5,268,651 A | 12/1993 | Kerth |
| 5,319,319 A | 6/1994 | Kerth |
| 5,397,944 A | 3/1995 | Dupuis |
| 5,406,279 A | 4/1995 | Anderson |
| 5,412,348 A | 5/1995 | Kasha |
| 5,477,481 A | 12/1995 | Kerth |
| 5,583,501 A | 12/1996 | Henrion |
| 5,594,439 A | 1/1997 | Swanson |
| 5,594,612 A | 1/1997 | Henrion |
| 6,002,299 A | 12/1999 | Thomsen |
| 6,259,313 B1* | 7/2001 | Lewicki ............ 327/563 |
| 6,307,430 B1 | 10/2001 | Thomsen |
| 6,462,612 B1* | 10/2002 | Roh et al. ............ 327/539 |
| 6,707,336 B2* | 3/2004 | Reber ............ 330/9 |
| 6,946,890 B1* | 9/2005 | Lei et al. ............ 327/310 |

OTHER PUBLICATIONS

Sanduleanu et al., Low-Power Low-Voltage Chopped Amplifier with a New Class AB Output . . . , Proc. ProRISC Workshop, 1997.
Sanduleanu et al., Low-Power Low-Voltage Chopped Transconductance Amplifier For Noise and Offset Reduction, ESSCIRC'97 Conference, 1997.
Sanduleanu, Power, Accuracy and Noise Aspects in CMOS Mixed-Signal Design, ISBN: 90-3651265-4, 1999.

* cited by examiner

*Primary Examiner*—Patricia Nguyen
(74) *Attorney, Agent, or Firm*—James J. Murphy; Thompson & Knight LLP

(57) ABSTRACT

An amplifier including a current source transistor for supplying a current to a node from a voltage rail and an input transistor switching the current at the node in response to an input signal chopped by a chopping signal. A cascode-chopping transistor operating both as a cascode transistor and a chopping transistor couples the node and an amplifier output in response to a bias voltage chopped by the chopping signal.

20 Claims, 6 Drawing Sheets

CHOPPER STABILIZATION CIRCUITS AND METHODS

FIELD OF INVENTION

The present invention relates in general to analog circuit techniques, and in particular, to chopper stabilization circuits and methods.

BACKGROUND OF INVENTION

Operational amplifiers ("opamps") are basic circuits utilized in a wide range of electronic circuits. In addition to amplification and buffering, opamps are typically utilized to implement operations such as summing, integration, multiplication, and others. Typical opamp applications include comparators, oscillators, filters, sample and hold circuits, and instrumentation amplifiers.

Opamps are often subject to an inherent input-referred offset voltage. Generally, when the voltages at the differential inputs of the opamp are equal, the output voltage should theoretically be at the mid-supply voltage. In actual applications, a slight offset in the output voltage from the mid-supply voltage occurs when the input voltages are equal. This voltage offset is commonly called the input-referred offset voltage. Additionally, opamp transistors typically generate flicker noise during switching.

In many more sensitive applications, reducing input-referred offset and flicker noise are important design considerations. Hence, one particular technique that has been utilized for addressing the problems of input-referred offset and flicker noise is chopper stabilization. In chopper stabilization, the signal of interest at the input of one or more stages of an opamp is modulated or "chopped" at a high frequency. Typically, the chopping frequency is selected to be at least twice the frequency of the band of the signal of interest to avoid aliasing. At the output of the chopper-stabilized stage, the signal of interest is demodulated back into the original signal band by a second chopping operation. This second chopping also modulates any inherent offset and/or flicker (1/f) noise out of the frequency band of the signal of interest.

While chopper stabilization advantageously minimizes the effects of input-referred offset and flicker noise, chopper stabilization can also reduce amplifier gain and/or produce chopping artifacts in the opamp output. In some applications, such as audio amplification, neither a significant reduction in gain nor the introduction of chopping artifacts in the opamp output signal is normally acceptable. For such noise and gain sensitive applications, new chopper stabilization techniques are required.

SUMMARY OF INVENTION

The principles of the present invention are embodied in a representative amplifier including a current source transistor for supplying a current to a node from a voltage rail and an input transistor switching the current at the node in response to an input signal chopped by a chopping signal. A cascode-chopping transistor operating both as a cascode transistor and a chopping transistor couples the node and an amplifier output in response to a bias voltage chopped by the chopping signal.

Embodiments of the present principles are advantageous in noise and gain sensitive amplifier applications, such as audio amplification. In particular, in folded-cascode amplifiers, and similar circuits, chopper stabilization is provided which maximizes voltage overhead and gain and minimizes chopping artifacts at the amplifier output.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–5 of the drawings, in which like numbers designate like parts.

Figure 1:
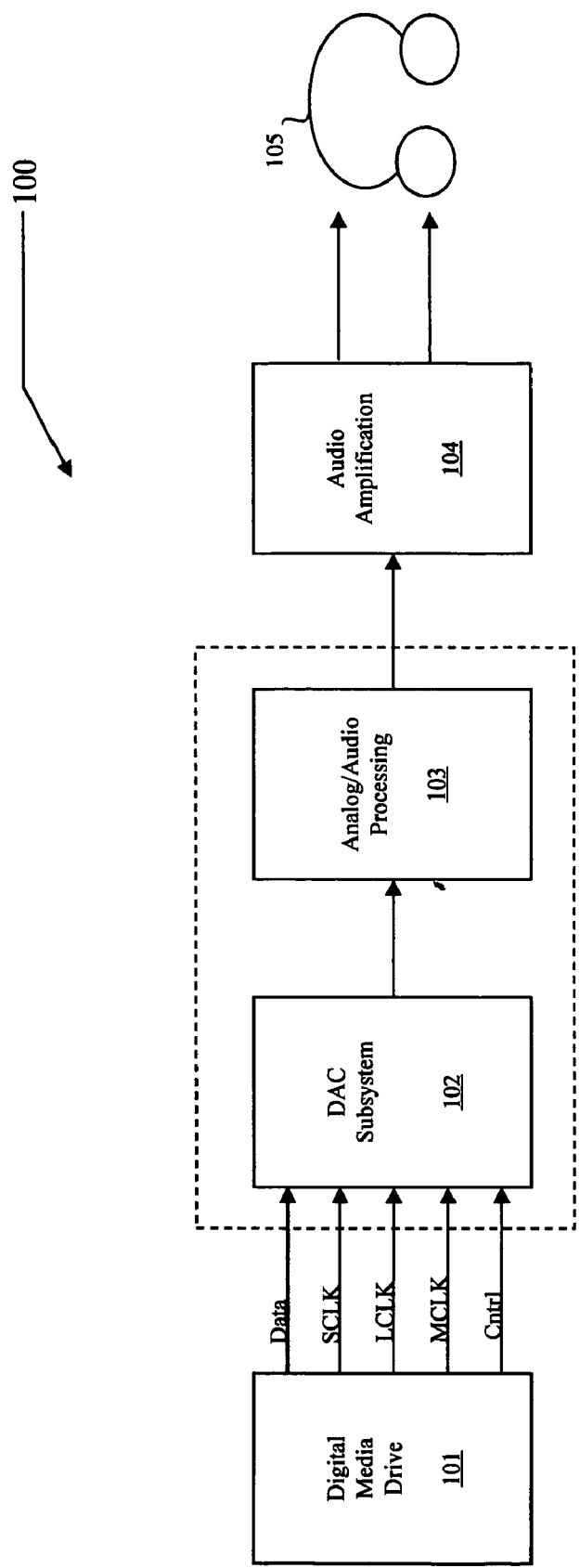
FIG. 1 is a high level block diagram of an audio system suitable for describing a typical application of the present inventive principles.

FIG. 1 is a high-level block diagram of an audio system 100 suitable for describing a typical system application of the principles of the present invention. Audio system 100 includes a digital media drive 101, such as a compact disk (CD) or digital versatile disk (DVD) player. Digital media drive 101 provides a serial digital audio data stream (SDATA) to a digital to analog converter (DAC) subsystem 102, along with associated clock and control signals. The clock signals include a master clock (MCLK) signal, which is utilized by the digital filters and delta-sigma modulators within DAC subsystem 102. A serial clock (SCLK) signal times the transfer of serial audio data SDATA between digital media drive 101 and DAC subsystem 102. Finally, a left-right clock (LRCK) signal determines whether left or right channel data are currently being transmitted on the SDATA path. Control signals (CNTL) support operations, such as system reset and filter de-emphasis control.

After conversion by DAC subsystem 102, the analog audio signals undergo further processing, such as analog filtering, within analog audio processing block 103. The resulting audio signals are finally amplified by audio amplification block 104. Audio amplification block 104, which preferably includes opamps in accordance with the inventive principles discussed below, drives a headset 105, or similar audio output device.

Figure 2A:
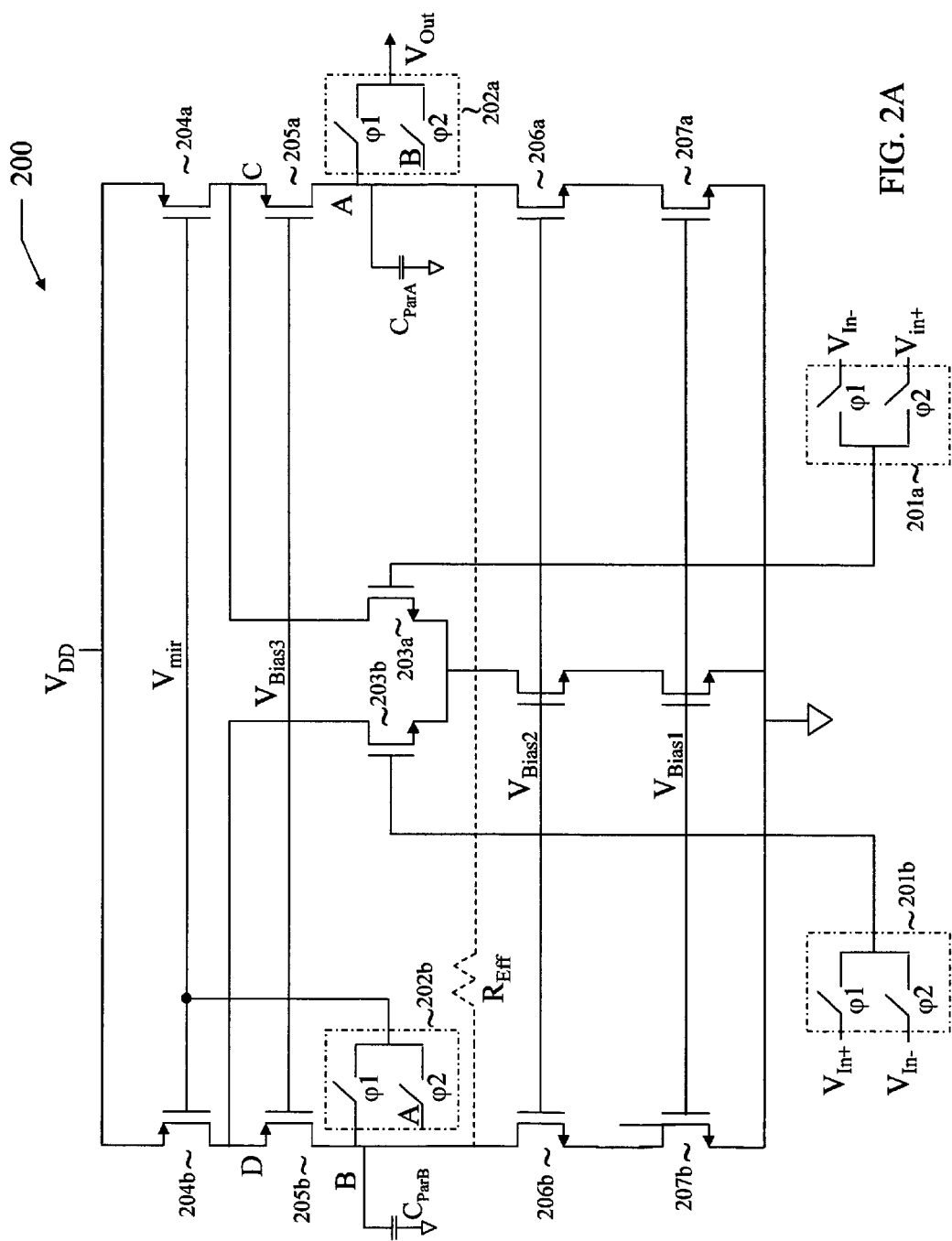
FIG. 2A is an electrical schematic diagram of a typical chopper-stabilized operational amplifier (opamp) according to the prior art.

FIG. 2A is an electrical schematic diagram of a typical conventional chopper stabilized folded-cascode opamp 200. In exemplary opamp 200, the differential input signals $V_{in+}$ and $V_{in-}$ are chopped by input transmission gates 202a and 202b at a chopping frequency $f_{Chop}$ in response to the non-overlapping chopping signals φ1 and φ2. Output transmission gates 202a and 202b demodulate the resulting differential output signals $V_{Out+}$ and $V_{Out-}$, and chop any input-referred offset voltage and flicker noise in response to the chopping signals φ1 and φ2.

The chopped differential input signals $V_{in+}$ and $V_{in-}$ drive a differential pair of NMOS transistors 203a and 203b which are coupled at nodes C and D between current mirror PMOS transistors 204a–204b and PMOS cascode transistors 205a–205b, respectively. The output nodes A and B are also coupled to NMOS cascode transistors 206a and 206b, respectively biased by NMOS bias transistors 207a and 207b.

One significant disadvantage of opamp 200 is a reduction in amplifier gain due to the switching of the output parasitic capacitances $C_{ParA}$ and $C_{ParB}$ at high impedance output nodes A and B during the switching of transmission gates 202a and 202b. Specifically, the switching of parasitic capacitances $C_{ParA}$ and $C_{ParB}$ produces an effective resistance $R_{Eff}$ between high impedance nodes A and B. In FIG. 2A, the effective resistance $R_{Eff}$ is represented in dashed lines and is generally described as:

$$R_{Eff} = [f_{Chop}(C_{ParA} + C_{ParB})]^{-1}$$

If all of the transistors 203a–203b, 204a–204b, 205a–205b, 206a–206b, and 207a–207b are biased to have approximately the same impedance $r_O$ and transconductance $g_m$, then the resulting gain $A_V$ of opamp 200 is approximately:

$$A_V \approx g_m[(g_m r_O^2/2)|R_{Eff}]$$

In the typical folded-cascode amplifier, such as opamp 200, the effective resistance $R_{Eff}$ is not substantially greater than the output impedance, thereby proportionally reducing the amplifier gain $A_V$. For example, if the chop frequency $f_{Chop}$ is nominally 3 MHz, and the total output parasitic capacitance $C_{ParA} + C_{ParB}$ is nominally 200 fF, the effective resistance $R_{Eff}$ is nominally 1.7 MΩ. In comparison, the typical output impedance of a folded-cascode amplifier, such as opamp 200, is in the range of 1 to 10 MΩ.

Figure 2B:
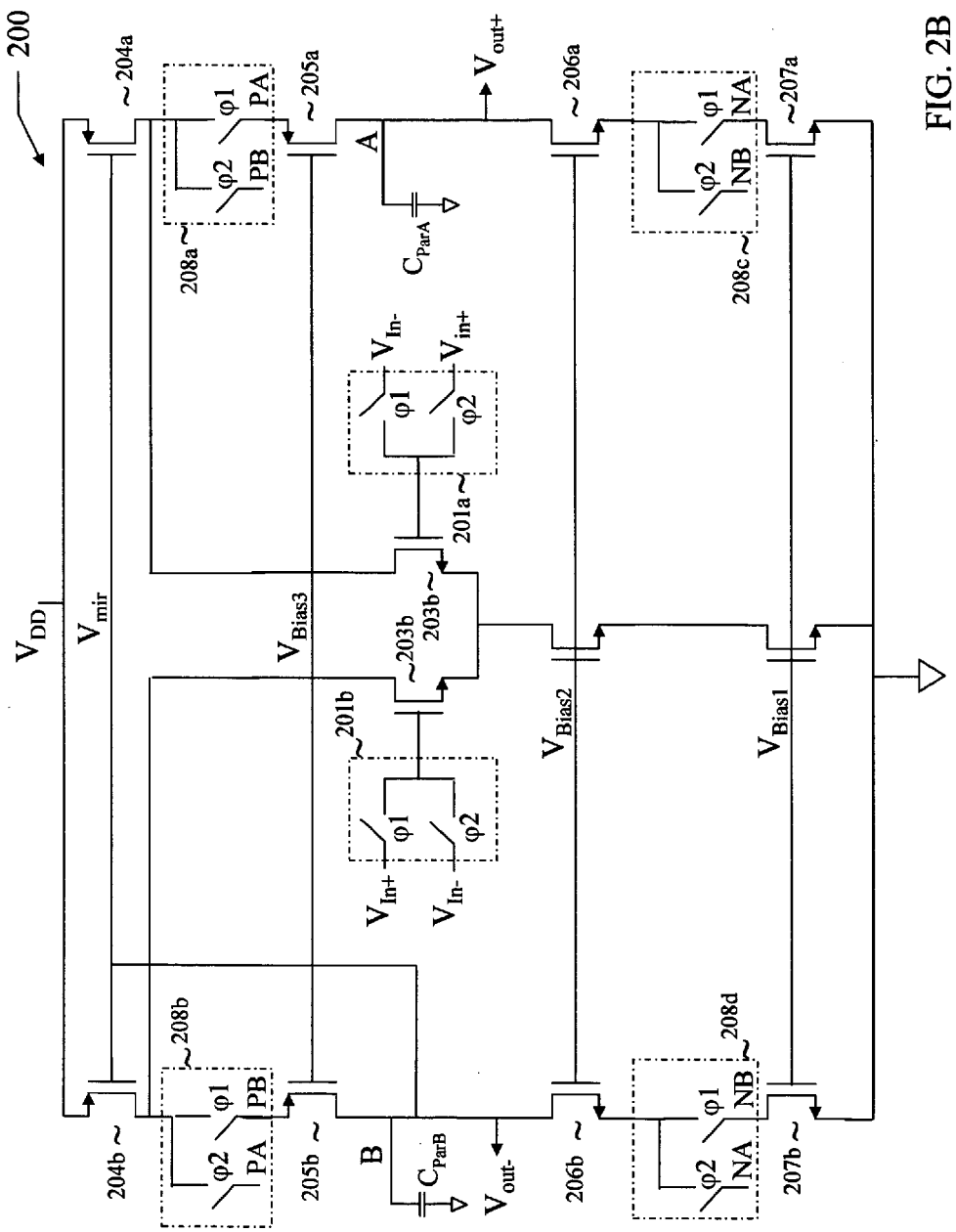
FIG. 2B is an electrical schematic diagram of another typical chopper-stabilized opamp according to the prior art.

One technique for addressing the problem chopping-induced gain reduction in a chopper stabilized folded-cascode opamp is illustrated in FIG. 2B. As shown in FIG. 2B, the output chopping operation is performed by transmission gates 208a–208d at the sources of PMOS cascode transistors 205a and 205b. Consequently, high impedance parasitic capacitances $C_{ParA} + C_{ParB}$ are not chopped. While the parasitic capacitances at the gates of cascade transistors 205a–205b and 206a–206b are chopped, since this chopping does not reduce the gain of opamp 200, since the sources of cascode devices are low impedance by design. Thus, neither the output impedance $R_O$ nor the opamp gain are reduced by chopping. However, the series switching transistors 208a–208c introduce additional voltage drops between the voltage rails, which limits the voltage overhead in low voltage designs.

Figure 3:
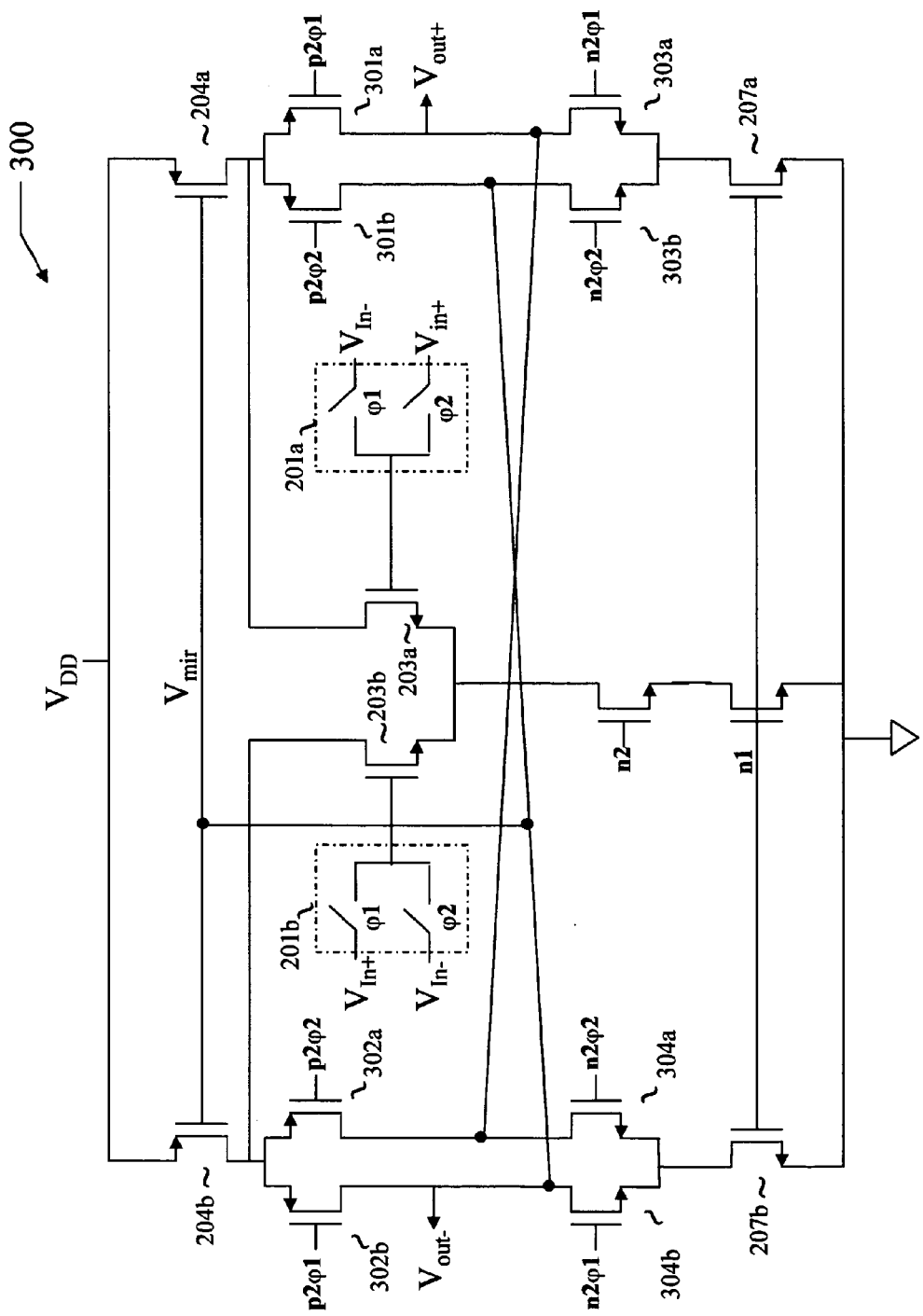
FIG. 3 is an electrical schematic diagram of a representative chopper-stabilized opamp embodying the principles of the present invention.

FIG. 3 is an electrical schematic diagram of an opamp 300 embodying the principles of the present invention. Opamp 300 is suitable as a stand-alone device or as a stage in a multiple stage device, such as a multiple-stage opamp Advantageously, opamp 300 minimizes effective resistance $R_{Eff}$ while maximizing voltage headroom.

Opamp 300 includes two pairs of p-type metal oxide semiconductor (PMOS) transistors 301a–301b and 302a–302b and two pairs of n-type metal oxide semiconductor (NMOS) transistors 303a–303b and 304a–304b. The outputs of PMOS transistors 301a–301b and NMOS transistors 303a–303b are cross-coupled with the outputs of PMOS transistors 302a–302b and NMOS transistors 304a–304b, respectively. The corresponding bias voltages p1 and n2 are clocked with the non-overlapping chopping signals φ1 and φ2 to generate the control signals p2φ1, p2φ2, n2φ1 and n2φ2.

In opamp 300, PMOS transistors 301a–301b and 302a–302b and NMOS transistors 303a–303b and 304a–304b each operate as both cascode devices and chopping switches. PMOS transistors 301a–301b and 302a–302b chop the output from the sources of current mirroring transistors 204a and 204b, respectively. NMOS transistors 303a–303b and 304a–304b respectively chop the input to the drains of biasing transistors 306a and 306b. Advantageously, the number of voltage drops between the power supply rail $V_{DD}$ and ground is minimized, thereby improving voltage headroom in opamp 300.

The drain of PMOS transistor 301a is cross-coupled with the drain of PMOS transistor 302a, such that parasitic capacitance $C_{ParA}$ of FIGS. 2A and 2B is always coupled to the output $V_{Out+}$. Similarly, the drain of PMOS transistors 301b and 302b are cross-coupled, as well as coupled to the mirror bias voltage $V_{Mir}$, such that parasitic capacitance $C_{ParB}$ also is always coupled to output $V_{Out-}$. Since parasitic capacitances $C_{ParA} + C_{ParB}$ do not switch during chopping, the effective resistance $R_{Eff}$ is substantially reduced or eliminated and the gain of opamp 300 is maximized.

In alternate embodiments, opamp 300 may be based on a PMOS differential output pair, in which all PMOS transistors shown in FIG. 3 are replaced with NMOS transistors, all NMOS transistors shown in FIG. 3 are replaced with PMOS transistors, and the voltages are appropriately varied.

Figure 4:
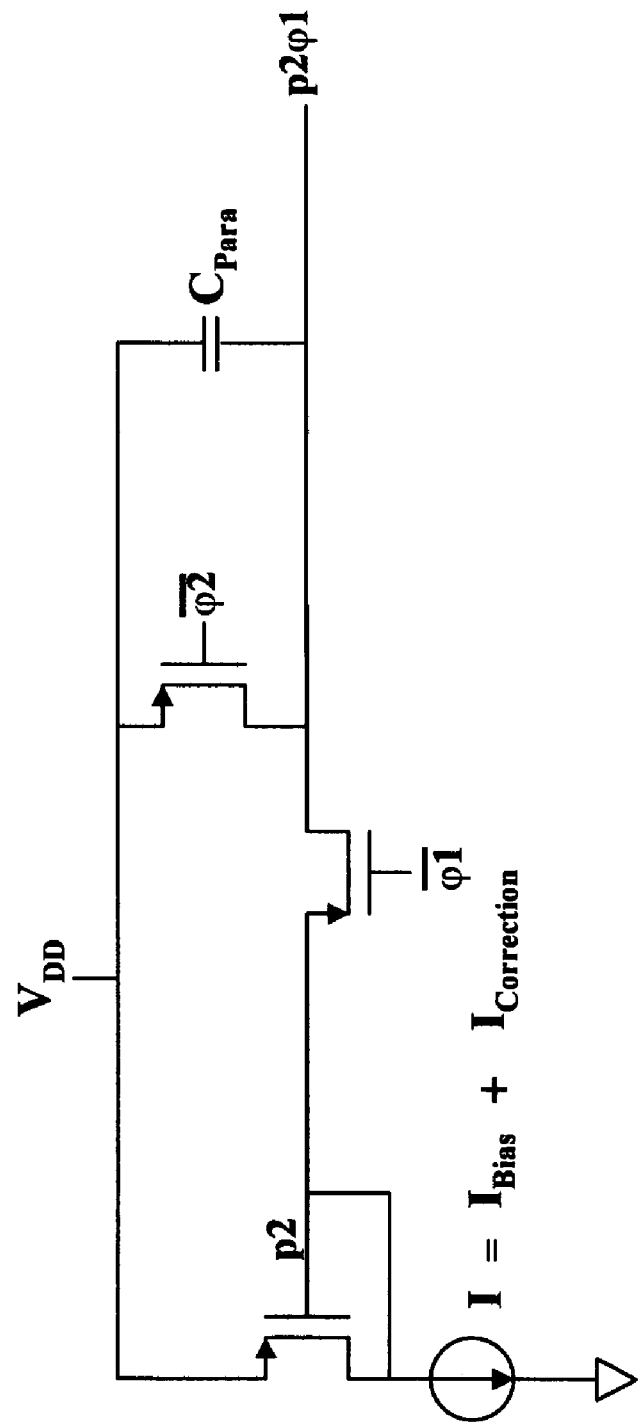
FIG. 4 is an exemplary circuit suitable for generating selected bias voltages shown in FIG. 3.

FIG. 4 is an electrical schematic of an exemplary circuit 400 suitable for generating the control signal p2φ1. Similar circuits are preferably utilized to generate the control signals p2φ2, n2φ1 and n2φ2. In circuit 400, the control signal p2φ1 is generated by switching a current I, in which:

$$I = I_{BIAS} + I_{Correction}$$

$I_{Bias}$ is equal to the cascode bias current, and $I_{Correction}$ is equal to:

$$I_{Correction} = (V_{DD} - p2)C_{Par}f_{Chop}$$

Figure 5:
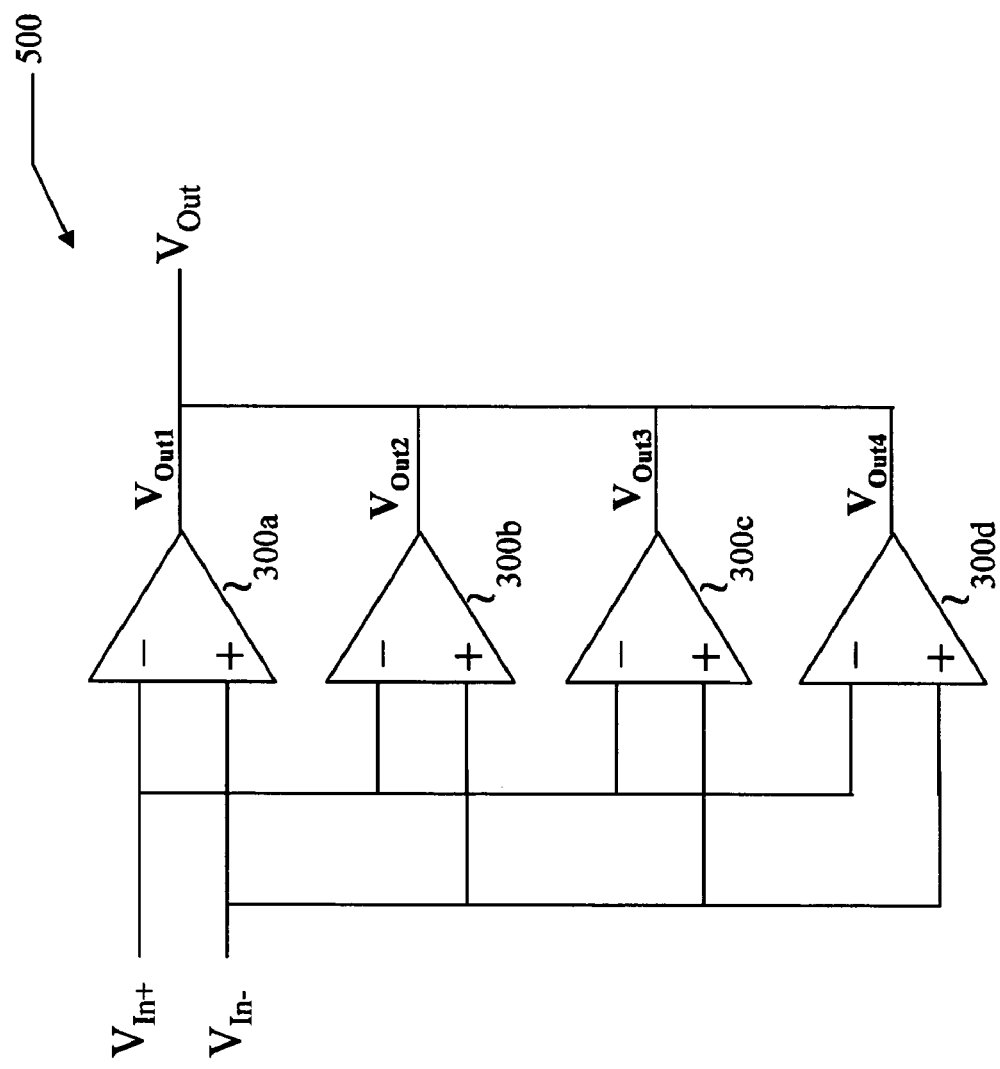
FIG. 5 is a block diagram illustrating a quadrature opamp system according to the principles of the present invention.

In order to avoid glitches and other artifacts due to the switching of currents, rather than voltages, four (4) opamps 300a–300b, as shown in FIG. 3, may be utilized in the quadrature chopping amplifier 500 shown in the electrical schematic of FIG. 5. In quadrature chopping amplifier 500, the chopped output signals $V_{Out1}$–$V_{Out4}$ from opamps 300a–300d are shifted out of phase in increments of forty-five degrees (45°) to minimize current glitches by chopping with respects to phase. If only two opamps 300a and 300b are utilized, the outputs $V_{Out1}$–$V_{Out2}$ of amplifiers 300a and 300b are ninety degrees (90°) out of phase with respects to each other.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. An amplifier comprising:
   a current source transistor for supplying a current to a node from a voltage rail;
   an input transistor switching the current at the node in response to a input signal chopped by a chopping signal; and
   a cascode-chopping transistor operating both as a cascode transistor and a chopping transistor for switching current at the node to an amplifier output in response to a bias voltage chopped by the chopping signal.

2. The amplifier of claim 1, comprising a further cascode-chopping transistor operating both as a cascode transistor and a chopping transistor for switching current from the node in response to the bias voltage chopped by another chopping signal non-overlapping with the chopping signal.

3. The amplifier of claim 1, further comprising:
   another cascode-chopping transistor coupling the amplifier output and operating both as a cascode transistor and a chopping transistor and a bias transistor in response to a further bias voltage chopped by the chopping signal.

4. The amplifier of claim 1, wherein the input transistor comprises an n-type field effect transistor and the current source transistor and the cascode-chopping transistor comprises a p-type field effect transistor.

5. The amplifier of claim 3, wherein the cascode-chopping transistor comprises a p-type field effect transistor and the another cascode-chopping transistor comprises an n-type field effect transistor.

6. A method of chopping an output of an amplifier comprising:
   supplying a current to a node from a voltage rail;
   switching the current at the node in response to a input signal chopped by a chopping signal; and
   switching current at the node to an amplifier output with a transistor operating both as a cascode transistor and a chopping transistor in response to a bias voltage chopped by the chopping signal.

7. The method of claim 6, further comprising switching current at the node to a bias source with another cascode-chopping transistor operating both as a cascode transistor and a chopping transistor in response to the bias voltage chopped by another chopping signal non-overlapping with the chopping signal.

8. The method of claim 6, further comprising switching current at the amplifier output to a bias transistor coupled to another voltage rail with another cascode-chopping transistor operating both as a cascode transistor and a chopping transistor in response to another bias voltage chopped by the chopping signal.

9. The method of claim 6, further comprising switching current output from the another cascode-chopping transistor to a bias transistor with a further cascode-chopping transistor operating both as a cascode transistor and a chopping transistor in response to a further bias voltage chopped by the another chopping signal.

10. A folded cascode amplifier comprising:
    first and second current mirror transistors biased by a current mirror bias voltage and supplying current to corresponding first and second nodes; and
    a first input transistor switching current at the first node in response to a first input signal chopped by a first chopping signal and a second input signal chopped by a second chopping signal;
    a second input transistor switching current at the second node in response to the first input signal chopped by the second chopping signal and the second input signal chopped by the first chopping signal;
    a first cascode-chopping transistor operating both as a cascode transistor and chopping transistor switching current from the first node to an amplifier output in response to a bias voltage chopped by the first chopping signal; and
    a second cascode-chopping transistor operating as both a cascode transistor and a chopping transistor switching current at the second node in response to the bias voltage chopped by the chopping signal.

11. The folded cascode amplifier of claim 10, further comprising:
    a third cascode-chopping transistor operating as both a cascode transistor and chopping transistor switching current from the first node in response to the bias voltage chopped by the second chopping signal; and
    a fourth cascode-chopping transistor operating as both a cascode transistor and chopping transistor for switching current at the second node in response to the bias voltage chopped by the second chopping signal.

12. The folded cascode amplifier of claim 11, wherein:
    the amplifier output is cross-coupled to an output of the fourth cascode-chopping transistor; and
    an output of the second cascode-chopping transistor is cross-coupled to an output of the third cascode-chopping transistor.

13. The folded cascode amplifier of claim 12 wherein the cross-coupled outputs of the second and third cascode-chopping transistors are further coupled to the current mirror bias voltage.

14. The folded cascode amplifier of claim 10, wherein the first and second input transistors comprise n-type field effect transistors and the first and second cascode-chopping transistors comprise p-type field effect transistors.

15. The folded cascode amplifier of claim 11, wherein the third and fourth cascode-chopping transistors comprises p-type field effect transistors.

16. The folded cascode amplifier of claim 11, further comprising:
    first and second bias transistors coupled to a voltage rail;
    a fifth cascode-chopping transistor coupling the amplifier output and the first bias transistor in response to a second bias voltage chopped by the first chopping signal; and
    a sixth cascode-chopping transistor coupling an output of the second cascode-chopping transistor to the second bias transistor in response to the second bias voltage chopped by the first chopping signal.

17. The folded cascode amplifier of claim 16, further comprising:
    a seventh cascode-chopping transistor coupling an output of the third cascode-chopping transistor and the first bias transistor in response to the second bias voltage chopped by the second chopping signal; and
    a eighth cascode-chopping transistor coupling an output of the second cascode-chopping transistor to the second bias transistor in response to the second bias voltage chopped by the second chopping signal.

18. The folded cascode amplifier of claim 17, wherein the first, second, third, and fourth transistors comprise p-type field effect transistors and the fifth, sixth, seventh, and eight transistors comprise n-type field effect transistors.

19. The folded cascode amplifier of claim 10, wherein the folded cascode amplifier is a part of system including a plurality of like folded cascode amplifiers receiving an input signal and outputting a set of output signals having different phases.

20. The folded cascode amplifier of claim 19, wherein the system includes two folded cascode amplifiers outputting output signals having a phase difference of ninety degrees.

* * * * *